(12) United States Patent
Liu et al.

(10) Patent No.: US 6,840,999 B2
(45) Date of Patent: Jan. 11, 2005

(54) IN SITU REGROWTH AND PURIFICATION OF CRYSTALLINE THIN FILMS

(75) Inventors: Chongyang Liu, Austin, TX (US); Allen J. Bard, Austin, TX (US)

(73) Assignee: Board of Regents The University of Texas System, Austin, TX (US)

( * ) Notice: Subject to any disclaimer, the term of this patent is extended or adjusted under 35 U.S.C. 154(b) by 0 days.

(21) Appl. No.: 09/907,546

(22) Filed: Jul. 16, 2001

(65) Prior Publication Data

US 2002/0033129 A1 Mar. 21, 2002

Related U.S. Application Data

(60) Provisional application No. 60/220,701, filed on Jul. 25, 2000.

(51) Int. Cl.[7] .............................................. C30B 13/00
(52) U.S. Cl. ............................. 117/43; 117/46; 117/47; 117/925; 117/926; 117/927
(58) Field of Search .............................. 117/43, 46, 47, 117/925, 926, 927

(56) References Cited

U.S. PATENT DOCUMENTS

| 4,165,249 A | | 8/1979 | Heywang ..................... 156/605 |
| 5,151,629 A | | 9/1992 | VanSlyke .................... 313/504 |
| 5,167,888 A | * | 12/1992 | Azoz et al. ................... 264/108 |
| 5,201,985 A | * | 4/1993 | Medvedieff .................. 156/609 |
| 5,315,129 A | | 5/1994 | Forrest et al. ................. 257/21 |
| 5,327,373 A | | 7/1994 | Liu et al. ..................... 365/112 |
| 5,693,956 A | | 12/1997 | Shi et al. ....................... 257/40 |
| 5,703,436 A | | 12/1997 | Forrest et al. ............... 313/506 |
| 5,707,745 A | | 1/1998 | Forrest et al. ............... 428/432 |

FOREIGN PATENT DOCUMENTS

| EP | 0436301 | 7/1991 |
| EP | 0562587 | 9/1993 |
| FR | 2144934 | 2/1973 |
| JP | 52 114504 | 9/1977 |
| JP | 60 037505 | 2/1985 |
| JP | 63-50400 | * 3/1988 |
| JP | 01 056424 | 3/1989 |
| JP | 2000 048955 | 2/2000 |

OTHER PUBLICATIONS

Fan et al., "Graphite–strip–heater zone–melting recrystallization of Si films," *J. Crystal Growth*, 63:453–483, 1983.

Leray et al., "Films of polyvinylpyrrolidone containing zinc tetraphenylprophyrin: evidence for aggregation of porphyrins in the presence of pyridine," *Thin Solid Films*, 303:295–301, 1997.

Adachi et al., "Organic electroluminescent device having a hole conductor as an emitting layer," *Appl. Phys. Lett.*, 55(15):1489–1491, 1989.

(List continued on next page.)

*Primary Examiner*—Robert Kunemund
(74) *Attorney, Agent, or Firm*—Fulbright & Jaworski, L.L.P.

(57) ABSTRACT

Amorphous or polycrystalline films have been recrystallized into single-crystal thin films (of micrometer thickness) by a zone melting technique, in which an electrically heated wire generated a narrow heated or molten zone (0.5–2 mm wide) on the substrate sandwiched between two pieces of glass or indium-tin-oxide-coated glass. The substrate can be either an organic or inorganic compound. When the molten zone was moved slowly (3–120 μm/min) across the layer from one end of the cell to the other, a single-crystal film was produced after a single pass. This technique allows for thin film purification and an improvement in electronic, optical, and optoelectronic properties of the thin film. After this treatment, the steady-state short-circuit photocurrent can be improved by several orders of magnitude. These films are useful in the fields of optics and electronics for improving the performance in devices such as thin-film transistors and organic light-emitting diodes.

45 Claims, 11 Drawing Sheets

OTHER PUBLICATIONS

Baldo et al., "Very high–efficiency green organic light–emitting devices based on electrophosphorescence," *Appl. Phys. Lett.*, 75(1):4–6, 1999.

Burrows et al., "Electroluminescence from trap–limited current transport in vacuum deposited organic light emitting devices," *Appl. Phys. Lett.*, 64(17):2285–2287, 1994.

Chandrasekhar, *Liquid Crystals*, Cambridge University Press, 2nd ed., 1992.

Chondroudis and Mitzi, "The use of ionic salt dyes as amorphous, thermally stable emitting layers in organic light–emitting diodes,"*Appl. Phys. Lett.*, 76(1):58–60, 2000.

Curry and Gillin, "1.54 $\mu$m electroluminescence from erbium (III) tris(8–hydroxyquinoline) (ErQ)–based organic light–emitting diodes," *Appl. Phys. Lett.*, 75(10):1380–1382, 1999.

Forrest, "Ultrathin Organic Films Grown by Organic Molecular Beam Deposition and Related Techniques," *Chem. Rev.*, 97:1793–1896, 1997.

Fox et al., "Effect of Structural Variations on Photocurrent Efficiency in Alkyl–Substituted Prophyrin Solid–State Thin Layer Photcells," *Chem. Mater.*, 10:1771–1776, 1998.

Fuchigami et al., "Polythienylenevinylene thin–film transistor with high carrier mobility," *Applied Physics Letters*, 63(10):1372–1374, 1993.

Garnier et al., "All–Polymer field–Effect Transistor Realized by Printing Techniques," *Science*, 265:1684–1686, 1994.

Gray and Goodby, *Smetic Liquid Crystals*, Leonard Hill: Glasgow, 1984.

Gregg et al., "Photovoltaic Effect in Symmetrical Cells of a Liquid Crystal Porphyrin," *J. Phys. Chem.*, 94:1586–1598, 1990.

Hamada et al., "Organic light–emitting diodes using 3– or 5–hydroxyflavone—metal complexes," *Appl. Phys. Lett.*, 71(23):3338–3340, 1997.

Hamada et al., "Organic light–emitting diodes using a gallium complex," *Appl. Phys. Lett.*, 72(16):1939–1941, 1998.

Hamada et al., "Red organic light–emitting diodes using an emitting assist dopant," *Appl. Phys. Lett.*, 75(12):1682–1684, 1999.

Horowitz and Delannoy, "An analytical model for organic–based thin–film transistors," *J. Applied Physics*, 70(1):469–475, 1991.

Horowitz et al., "Thin–film Transistors Based on Alpha–Conjugated Oligomers," *Synthetic Metals*, 41–43:1127–1130, 1991.

Karl, In *Crystals, Growth, Properties, and Applications*, Freyhardt, (Ed.); Springer Verlag: Heidelberg; 4, 1980.

Karl, "Organic semiconductors: purification and crystal growth," *Mol. Liq. Crys.*, 171:157–177, 1989.

Kido et al., "Multilayer white light–emitting organic electroluminescent device," *Science*, 267:1332–1334, 1995.

Koezuka et al., "Polythiophene field–effect transistor with polypyrrole worked as source and drain electrodes,"*Applied Physics Letters*, 62(15):1794–1796, 1993.

Lawson and Nielsen, *Preparation of Single Crystals*, Butterworths: London, 1958.

Liu and Bard, "Optoelectric charge trapping/detrapping in thin solid films of organic azo dyes: application of scanning tunneling microscopic tip contact to photoconductive films for data storage," *Chem. Mater.*, 10:840–846, 1998.

Liu and Bard, "Enhanced Quantum Efficiencies and Short–Circuit Photocurrents in Solid Porphyrin Thin Film Cells by Internal Electric Fields," *J. Am. Chem. Soc.*, 120:5575–5576, 1998.

Liu and Bard, "Optoelectronic Properties and Memories Based on Organic Single–Crystal Thin Films," *Acc. Chem. Res.*, 32:235–245, 1999.

Liu et al., "Effect of Structural Order on the Dark Current and Photocurrent in Zinc Octakis ($\beta$–decoxyethyl)porphyrin Thin–Layer Cells," *J. Phys. Chem.*, 99:7632–7636, 1995.

Liu et al., "Effect of Orientation of Porphyrin Single–Crystal Slices on Optoelectronic Properties," *J. Phys. Chem.*, 100:3587–3591, 1996.

Liu et al., "Electro–optical Charge Trapping in Zinc Porphyrin Films on Indium Tin Oxide and /$Sio_2$/Si," *J. Electrochem. Soc.*, 143(6):1914–1918, 1996.

Liu et al., "Effect of an electric field on the growth and optoelectronic properties of quasi–one–dimensional organic single crystals of 1–(phenylazo)–2–naphthol," *Chem. Mater.*, 9:943–949, 1997.

Liu et al., "Reversable charge trapping/detrapping in a photoconductive insulator of liquid crystal zinc porphyrin," *Chem. Mater.*, 9:1422–1429, 1997.

Liu et al., "High–Density Nanosecond Charge Trapping in Thin Films of the Photoconductor ZnODEP," *Science*, 261:897–899, 1993.

Miyauchi et al., "Junction Field–Effect Transistor Using Polythiophene as an Active Component," *Synthetic Metals*, 41–43:1155–1158, 1991.

O'Brien et al., "Improved energy transfer in electrophosphorescent devices," *Appl. Phys. Lett.*, 74(3):442–444, 1999.

Saito et al., "Orientational dependence of the color and photoconductivity of 1,4–Di–p–toluidinoanthraquinone single crystals," *Chem. Mater.*, 9:1318–1327, 1997.*

Sheats et al., "Organic Electroluminescent Devices," *Science*, 273:884–888, 1996.*

Strukelj et al., "Organic Multilayer White Light Emitting Diodes," *J. Am. Chem. Soc.*, 118:1213–1214, 1996.*

Tang and Vanslyke, "Organic electroluminescent diodes," *Appl. Phys. Lett.*, 51(12):913–915, 1987.*

Tao et al., "Highly efficient blue electroluminescence of Lithium Tetra–(2–methyl–8–hydroxy–quinolinato) Boron," *J. Am. Chem. Soc.*, 121:9447–9448, 1999.*

Thulstrup and Michl, *Elementary Polarization Spectroscopy*, VCH: New York, 1989.*

Tredgold, *Order in Thin Organic Films*, Cambridge University Press: Cambridge, 1994.*

Wright, *Molecular Crystals*, 2d ed., Cambridge University Press: Cambridge, 1995.*

Yang et al., "Blue organic light–emitting diode using 1,4–bis(1,1–diphenyl–2–ethneyl)benzene as an emitter," *Synthetic Metals*, 108:95–100, 2000.*

Zhang et al., "A new coumarin derivative used as emitting layer in organic light–emitting diodes," *Synthetic Metals*, 106:157–160, 1999.*

* cited by examiner

IN SITU REGROWTH AND PURIFICATION OF CRYSTALLINE THIN FILMS

This application claims priority to provisional application No. 60/220,701 filed Jul. 25, 2000, incorporated herein by reference.

The government may owns rights to this invention pursuant to National Science Foundation contract number CHE9876855.

BACKGROUND OF THE INVENTION

I. Field of the Invention

The present invention relates to the field of organic and inorganic thin films.

II. Related Art

Single crystals of high perfection and purity are desirable when studying the intrinsic properties of solid-state substances (Karl, 1980; Lawson and Nielsen, 1958). This has been achieved for many inorganic materials, such as Si and GaAs. In fact, the modem electronics industry benefited substantially from an enormous effort toward the growth and purification of silicon single crystals. In addition, our understanding of the fundamental properties of a solid such as structural, electronic, and optical properties depends strongly on the crystal quality. Progress in this area for organic molecular crystals has been limited mainly due to certain intrinsic characteristics of the molecules and their constituent solids. For example, the large spacing and weak interactions among neighboring molecules in a crystal make it relatively easy for foreign molecules to be incorporated into the lattice, often leading to an impure crystal with many defects (Wright, 1995).

A high-temperature annealing process to improve the crystal quality and purity (by allowing impurities to diffuse out), which is effective for inorganic solids, is not available for most organic crystals because of their low melting points and poor thermal stability. On the other hand, organic molecules generally have strong optical absorption coefficients, so thin films (of micrometer thickness) are required for characterization of their optoelectronic properties. The orientational dependence of light absorption of many molecules can only be studied with single crystals. To our knowledge, no externally controllable technique for the growth of single-crystal, micrometer thick films exists, although ordered ultrathin films (~nm) can be prepared by Langmuir Blodgett deposition (Treggold, 1994), from self-assembled mono- and multilayers in solution, and more recently by organic molecular beam epitaxy in an ultrahigh vacuum chamber (Forrest, 1997).

The inventors previously demonstrated that several organic single-crystal thin-films can be prepared in sandwich cells made of two pieces of indium-tin oxide (ITO)-coated glass spaced about 1–2 $\mu$m apart, by capillary filling of the molten organic compound (Liu and Bard, 1999; Gregg et al., 1990). Examples of the organic compound are porphyrin, (Liu et al., 1996), sudan I (Liu et al., 1997) and solvent green 3 (Saito et al., 1997). However, many other materials form only amorphous or polycrystalline films when using the same procedure. Moreover, the purity of most organic films does not approach that characteristic of inorganic solid-state electronic materials.

It is believed that no other technique exists for growing a single-crystal film from an amorphous or microcrystalline film on a substrate such as glass or ITO. The technique of organic molecular beam epitaxy is performed in an ultrahigh vacuum chamber on a single crystal substrate, making it expensive and of limited usefulness (Forrest 1997). Lattice matching is a prerequisite in molecular beam epitaxy and an ordered structure can only be extended to a limited number of molecular layers to produce films of nanometer thickness.

For bulk organic materials and many inorganic materials, methods such as zone melting and zone refining are known wherein the purity and crystallinity of powders contained in tubes or other bulk configurations of organic substances is increased. Materials can also be purified by sublimation. However, the crystallinity of tube-processed or sublimed material will be reduced upon processing into a thin film. A method for the in situ purification is necessary for thin films.

SUMMARY OF THE INVENTION

The present invention comprises a method for treating a thin film comprising: providing substrate coated with a thin film; positioning said substrate proximal to a heat source at a distance and for a time sufficient to form a heating zone in said film, wherein said heat zone is below the decomposition temperature of said film; and moving said substrate relative to said heater source at a speed sufficient to permit formation of a heating zone in said thin film proximal to said heat source.

The thin film comprises an organic compound or an inorganic compound. It is a further aspect of the invention that said substrate is passed proximal to said heat source once, twice, three times, four times, or a multiple number of times. The speed used for the different passes may be the same or different. There may be two or more speeds used. It is an aspect of the invention that the film is melted by said heat source.

Another embodiment of the invention is the method of producing a crystalline thin film comprising: providing a substrate coated with a thin film; positioning said substrate proximal to a heat source at a distance and for a time sufficient to form a heating zone in said film, wherein said heat zone is below the decomposition temperature of said film; and moving said substrate relative to said heater source at a speed sufficient to permit formation of a heating zone in said thin film proximal to said heat source.

The present invention comprises a method for producing an organic crystalline thin film comprising: placing an organic compound in a sample holder; positioning said sample holder proximal to a heat source at a distance and for a time sufficient to form a molten zone in said organic compound proximal to said heater source; and moving said sample holder relative to said heater source at a speed sufficient to permit formation of a molten zone in said organic compound proximal to said heat source. With this method, the organic compound forms an organic single-crystal thin film after exposure to said molten zone.

In an embodiment of the invention, said sample holder comprises two parallel flat surfaces. These flat surfaces may form a sandwich cell and can consist of glass, glass coated with indium-tin-oxide, silicon or any other flat substrates and may be separated by about 0.1 $\mu$m to about 50 $\mu$m, or from about 1.5 $\mu$m to about 2.5 $\mu$m. A spacer which can be made out of epoxy may be used to maintain a constant distance between the two flat surfaces.

A further embodiment comprises the crystalline thin film having an enhanced steady-state short-circuit photocurrent ($I_{SC}$) as compared to the corresponding amorphous or polycrystalline form. This enhancement may be one order of magnitude, two orders of magnitude, three orders of magnitude or four orders of magnitude.

Yet another embodiment comprises the organic single-crystal thin film contains fewer impurities than said organic compound before purification with the molten zone.

It is conceived that the sample holder is moved across the heat source. One means of moving the sample holder is with an inchworm motor which can move the sample at a fixed rate across the wire. It is also conceived that the heated wire is moved across the sample holder. The speed is from about 0.5–300 μm/min, or 3–120 μm/min, or more preferably 3, 6, 15, 30, 60, or 120 μm/min and is limited to a rate at which a molten zone forms.

The invention comprises said heating source is a wire, which is preferable in a linear configuration. The wire is from about 10 μm to 3.0 mm in diameter, or more preferentially from about 50 μm to about 2.0 mm in diameter. The wire may be platinum, nichrome, nickel, or any other thin conductive material. The wire may be heated by passing an electrical current through the wire. Because some wires have a tendency to lengthen when heated, it is conceived that the wire is tightened after the initiation of heating to keep it tight and maintain firm contact with the sample holder. The heated wire will cause formation of a molten zone in the organic compound wherein said molten zone is about 0.1–3.0 mm wide, or about 0.5 mm–2.0 mm wide.

In an embodiment of the invention, the organic compound comprises an amorphous or polycrystalline film. The film can be 1,4-bis(butylamino)-9,10-anthraquinone or a porphoryin such as zinc(II)meso-5,10,15,20-tetrakis-n-(undecyl) porphyrin or zinc(II)2,3,7,8,12,13,17,18-octa-n-decylporphorin. The organic compound may also consist of a mixture of more than one organic compounds.

It is a further embodiment of the invention that said sample holder is passed proximal to said heat source once, twice, three times, four times, or a multiple number of times. The speed used for the different passes may be the same or different. There may be two or more speeds used.

The organic compound may be provided as an amorphous or polycrystalline thin film. The thin film may be prepared by thermal evaporation onto a surface, capillary filling, deposition onto a surface, self assembly, Langmuir Blodgett deposition, spin coating, molecular beam epitaxy or other methods.

Another embodiment of the invention is an organic crystalline thin film produced by a method comprising: providing an organic compound in a sample holder; positioning said sample holder proximal to a heat source at a distance and for a time sufficient to form a molten zone in said organic compound proximal to said heater source; and moving said sample holder relative to said heater source at a speed sufficient to permit formation of a molten zone in said organic compound proximal to said heat source.

As used herein the specification, "a" or "an" may mean one or more. As used herein in the claim(s), when used in conjunction with the word "comprising", the words "a" or "an" may mean one or more than one. As used herein "another" may mean at least a second or more.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

For a more complete understanding of the present invention, and the advantages thereof, reference is now made to the following descriptions taken in conjunction with the accompanying drawings, in which:

FIG. 1B Schematic diagram of the zone melting apparatus.

FIG. 2A Crystals grown by capillary filling irradiated with polarized light. FIG. 2B Crystals first grown by capillary filling and then regrown with the zone melting technique for upper-right portion (growth rate, 16 μm/min) irradiated with polarized light. FIG. 2C Crystals re-grown with the zone melting technique (growth rate 15 μm/min) imaged between two crossed polarizers at a zone at the end of a pass.

FIG. 3A A needle-shaped polycrystalline film and FIG. 3B a re-grown single-crystal domain under identical conditions. Irradiated spot, 750 μm diameter. The zero current level is indicated in both curves (which are shifted for clarity).

FIG. 4A Crystals grown by capillary filling and imaged between two crossed polarizers. FIG. 4B Crystals first grown by capillary filling and then re-melted briefly with the heating wire and quickly cooled by turning the power off. FIG. 4C Crystals re-grown with the zone melting technique (growth rate 6 μm/min).

FIG. 5A–B were obtained from the areas shown in FIG. 4A–B respectively.

FIG. 8A–B Imaged without polarizer at two different locations. FIG. 8C Imaged between two crossed polarizers at the same location as in FIG. 8B.

DESCRIPTION OF THE PREFERRED EMBODIMENTS

The inventors have investigated a zone melting technique for direct use with the sandwich cells to convert amorphous and polycrystalline films into single-crystal films with higher purity and improved properties. This externally-controlled, nonepitaxial growth of organic single-crystal thin films is useful in improving the performance of organic film optical and electronic devices.

Thus, the present invention is drawn to a method of producing single-crystal thin films from amorphous or polycrystalline thin films in situ. The simultaneous growth and purification of single-crystal thin films leads to a large improvement of the optoelectronic properties of the film. This simple zone melting technique offers a convenient way to prepare films of molecular materials for possible applications in optics and electronics (Sheats et al., 1996; Liu et al., U.S. Pat. No. 5,327,373; Liu et al., 1996b). The higher degree of crystallinity of the films produced by this method gives the films superior optical, electronic, and optoelectronic properties and allows for the use of these films in devices such as thin film transistors and light-emitting diodes.

With this zone melting procedure, amorphous films and polycrystalline needles (with diameters at the nanometer level) were recrystallized into millimeter-sized single-crystal thin films, and the short-circuit photocurrent ($I_{SC}$), was improved by up to several orders of magnitude.

I. Apparatus and Starting Films

Figure 1:
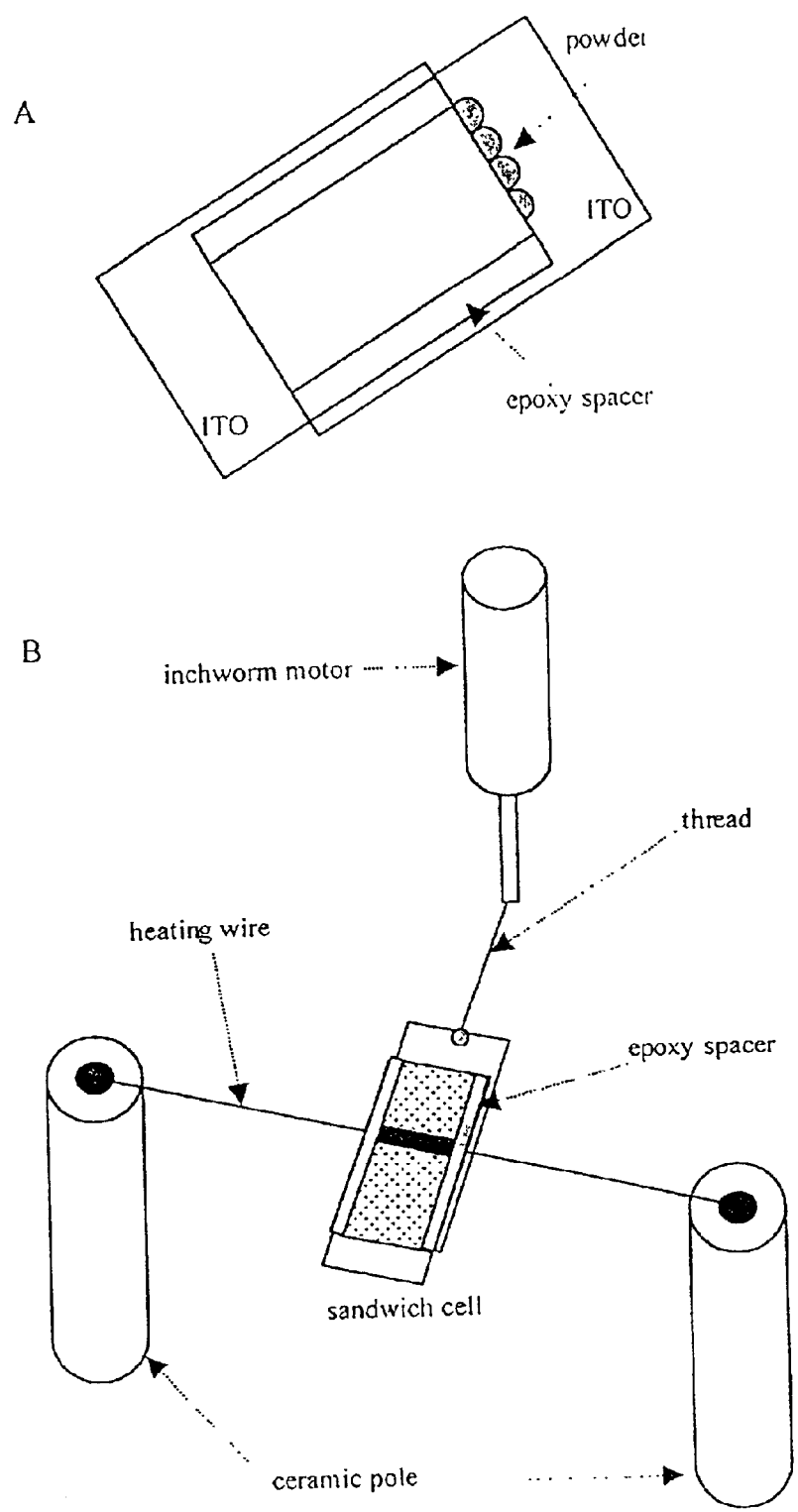
FIG. 1A–B FIG. 1A Schematic diagram for the preparation of an ITO/organic film/ITO sandwich cell.

The apparatus of the zone-melting technique is schematically shown in FIG. 1B. Cells were placed on an electric heating wire, which generated a narrow molten zone in the organic film. The width of the molten zone was determined by the thickness of the substrate, the temperature, and the diameter of the heating wire. The cell was then slowly moved at a fixed rate with an inchworm motor (Burleigh) controlled by the same device that is used to move the electrode in a scanning electrochemical microscope. A monocular can be used to observe the molten zone. In the operation, sometimes the heating wire needed to be tightened at a high temperature to keep it straight and maintain a firm contact to the substrate. A slight bending of the heating wire would cause a deformation of the molten zone. All of the heating wires disclosed worked well with the glass cells but not with the ITO ones, especially when the melting point of the compound studied was high and the ITO-coated glass was relatively thick (0.9 mm) because the thinner wire was unable to raise the temperature high enough to melt the compound even after it was glowing red in the non-contact area. The temperature was raised slowly to avoid breaking the glass substrates. Pt wire is advantageous because it is more resistant to air oxidation and lasted longer than other wires used.

Any sample cell capable of holding the thin film can be used. The preferred cell is a sandwich cell sample as shown in FIG. 1A. This schematic demonstrates the preparation of an ITO-coated glass/organic film/ITO-coated glass sandwich cell. The cell can be made out of, for example, glass, ITO-coated glass, quartz or silicon. The inventors created a zinc porphyrin device on Si (Liu et al., 1996b)

Films prepared with a variety of methods can be purified or improved with the zone-melting technique. Preferentially, the film is produced by capillary filling in a sandwich cell. However, there are many other methods of producing thin films that can undergo zone-melting. The thin film may be prepared, for example, by thermal evaporation, monolayer and multi-layer self assembly from solution, Langmuir Blodgett deposition, spin coating, chemical vapor deposition, and molecular beam epitaxy.

The film may contain any organic or inorganic material that can be formed into a thin film and has a melting point below that which can be reached by the heat source. Some compounds that can be re-grown with the melt-zone method include, but are not limited to: 1,4-bis(butylamino)-9,10-anthraquinone, a porphoryin such as zinc(II)meso-5,10,15, 20-tetrakis-n-(undecyl)porphyrin and zinc(II)2,3,7,8,12,13, 17,18-octa-n-decylporphorin, 8-hydroxyquinoline aluminum, aromatic compounds, such as anthracene, and polymers like oligo(phenylene vinylenes).

II. Film Crystallinity

Amorphous films have short range order, which is the ordering of the first- or second-nearest neighbors of an atom, however, no long-range order exists. Amorphous films are also known as glasses and are defined as any noncrystalline solid in which the atoms and molecules are not organized in a definite lattice pattern.

Polycrystalline films consist of randomly oriented crystalline regions. The films are actually composed of millions of grains (small crystals) packed together. Each individual grain has a different orientation than its neighbors. Although long-range order exists within one grain, at the boundary between grains, the ordering changes direction. The random arrangement of the boundaries between individual crystallites in a polycrystal causes them to scatter a beam of light instead of reflecting or refracting it uniformly, so that even colorless polycrystals are opaque. Other mechanical, electrical, or magnetic properties of single crystals are similarly altered by the absence of long-range order in polycrystals.

Single-crystal films consist of an orderly three-dimensional arrangement of the molecules repeated throughout the entire volume. In this application, single-crystal films need not be entirely a single crystal; some defects are expected, especially at the edges of the crystal. A single-crystal film should contain predominately a single crystal orientation on the size scale of the device to be made from the single-crystal thin film.

III. Optical and Optoelectrical Properties

Single-crystals films should show better optical and opto-electrical properties such as higher photoconductance, larger photocurrents and faster response compared to amorphous and polycrystalline structures (Liu and Bard, 1999; Gregg et al., 1990; Liu et al., 1996). Photon-induced charge carriers travelling through an organic molecular crystal are frequently trapped and detrapped at defect sites including structure dislocations, grain boundaries, and impurities (Liu et al., 1993; Liu et al., 1997; Liu et al., 1998). It is therefore interesting to compare the charge transport properties in a thin film before and after the zone melting treatment.

Previous studies show that under certain conditions charge trapping and detrapping are reversible and can be externally controlled (Liu et al., 1993; Liu et al., 1997; Liu et al., 1998). This can be measured by examining the short circuit photocurrent ($I_{SC}$), as was done with symmetrical sandwich cells containing organic molecular crystals, ITO/organic film/ITO, with irradiation (Liu and Bard, 1999; Gregg et al., 1990; Liu et al., 1996; Liu et al., 1997; Liu et al., 1993; Liu et al., 1997; Liu and Bard, 1998a; Liu et al., 1995; Liu and Bard, 1998b). Photogenerated electrons are preferentially injected into the irradiated ITO electrode from the excited molecules and holes move in the opposite direction to maintain a steady-state photocurrent across the whole film. Photoconductivity of the organic layer directly affects the charge carrier mobility and thus the photocurrent. In an amorphous or polycrystalline layer, charge trapping and detrapping at grain boundaries, structural defects, and impurity sites slows the charge transport to a significant extent, so it is expected that charge transport will be significantly faster in thin films after having gone through at least one pass of zone-melting.

IV. Quality of the Thin Films

In zone-melting, impurities, which are more soluble in liquid than in the solid phase, are carried along the film in the direction of movement of the molten zone and are swept to the end of a sample (Karl, 1989). This process will allow for a substantially pure film to be formed. The impurity-rich concentration in some areas could become sufficiently high to form impurity-rich domains that prevented single crystals from growing larger and could nucleate structural defects. This is more likely to occur at the end of the film or at the edges Growth rate has a strong effect on the crystal quality; a slower rate produces larger crystals with fewer defects. Since the interactions between the organic molecules are weak, a longer time may be required for molecules arriving at a growing crystal surface to attain their equilibrium positions and minimize the incorporation of impurity molecules and defects.

Heating thin films at temperatures below the melting point of the thin films can cause an annealing of the film to produce a more crystalline material; the zone does not have to consist of molten material for this process to be effective. For glass and other amorphous films, annealing below the melting point has been shown to increase the optical and/or electronic properties of the films.

V. Uses for Crystalline Thin Films

There are a variety of uses for single-crystal thin films because of their enhanced physical properties (e.g., optical, electric, optoelectronic, etc.) including improving the performance of organic film optical and electronic devices. Some of the more marketable devices include improved organic solid-state light-emitting diodes (OLEDs) and thin-film transistors (TFT). Other uses for single crystals of high perfection and purity are for studying the intrinsic properties of solid-state substances.

OLEDs may eventually offer an alternative to LEDs and LCDs in flat-panel displays, perhaps affording flatter, brighter and more flexible displays at lower cost. Like their polymer counterparts, OLEDs employing small molecules as emitters have shown commercial potential (Tang, et al., 1987; Yang et al., 2000, Chondroudis et al., 2000; Baldo et al., 1999; O'Brien et al., 1999; Tao et al., 1999; Zhang et al., 1999; Curry et al., 1999; Hamada et al., 1998; Hamada et al., 1997; Hamada et al., 1999; Adachi et al., 1989; Burrows et al., 1994; Kido et al., 1995; Strukelj et al., 1996). OLEDs are useful in a variety of applications including use in watches, telephones, laptop computers, pagers, cell phones, calculators, lighting fixtures and the like. See, for example, U.S. Pat. Nos. 5,693,956; 5,151,629; 5,707,745; and 5,703,436 for conventional OLED devices.

The primary component of the LCD, and the component that must be enhanced for further LCD improvements to occur, is the thin-film transistor (TFT). TFTs are typically fabricated on a transparent substrate such as quartz, glass, or even plastic. TFTs are almost exclusively used as switches to allow the various pixels of the LCD to be charged in response to the driver circuits. TFT performance will be improved, and driver circuit functions incorporated into TFTs, by increasing the electron mobility in the TFT devices. Increasing the electron mobility of a transistor results in a transistor having faster switching speeds. Improved TFTs having increased electron mobility yield smaller LCD screens, lower power consumption, and faster transistor response times.

TFTs with an organic active layer are also known. See, for instance, F. Garnier et al., Science, Vol. 265, pp. 1684–1686; H. Koezuka et al., Applied Physics Letters, Vol. 62 (15), pp. 1794–1796; H. Fuchigami et al., Applied Physics Letters, Vol. 63 (10), pp. 1372–1374; G. Horowitz et al., J. Applied Physics, Vol. 70 (1), pp. 469–475, and G. Horowitz et al., Synthetic Metals, Vol. 41–43, pp. 1127–1130. These devices typically are field effect transistors (FETs). Such devices potentially, have significant advantages over conventional TFTs, including a potentially simpler and cheaper fabrication process, the possibility for low temperature processing, and compatibility with non-glass (e.g., plastic) substrates. Bipolar transistors that utilize both p-type and n-type organic materials are also known. See, for instance, U.S. Pat. No. 5,315,129; S. Miyauchi et al., Synthetic Metals, 41–43 (1991), pp. 1155–1158, disclose a junction FET that comprises a layer of p-type polythiophene on n-type silicon. However, organic TFTs have not yet reached large scale commercialization, at least in part due to relatively poor device characteristics of prior art organic TFTs.

VI. EXAMPLES

The inventors report here a zone melting technique for the growth and purification of organic single-crystal films within thin-layer (~1 $\mu$m thick) sandwich cells for three different compounds: 1,4-bis (butylamino)-9,10-anthraquinone (solvent blue 35 or SB35), zinc (II) meso-5, 10, 15, 20-tetrakis-n-(undecyl) porphyrin (porphyrin 1) and zinc (II) 2, 3, 7, 8, 12, 13, 17, 18-octa-n-decylprophyrin (porphyrin 2). Porphyrins 1 and 2 have four and eight long hydrocarbon chains, respectively.

Microscope cover glass (~130–170 $\mu$m thick, Fisher Scientific) and ITO (Delta Technologies) were employed as substrates. The symmetrical sandwich cells containing an organic layer were fabricated by a method reported earlier (Liu and Bard, 1999; Gregg et al., 1990; Liu et al., 1996). Briefly, the organic powders were placed at the opening of the empty cells, which were then filled by capillary action with the molten compounds (FIG. 1A). Cells of glass/organic-layer/glass could be easily made to any thickness and were used primarily for the initial optimization of the experimental conditions for the single-crystal growth; ITO/organic-layer/ITO cells ~1.5–2.5 $\mu$m thick) were used for the optoelectronic characterizations.

The organic films were examined with an optical microscope (Olympus Model BHTU) under ordinary or polarized light. Photocurrent measurements were carried out in two different ways. First, a monochrometer was placed in front of a halogen lamp (300 W) to generate a single wavelength light of 568 nm for porphyrin 1 and 586 nm for porphyrin 2. The two wavelengths correspond to the optical excitation of the ground state to the first singlet state for the two porphyrin molecules (Fox et al., 1998). In another case, cells were fixed on the microscope stage and the light beam was focused to a desired size on a preselected domain of the film (Saito et al., 1997; Liu et al., 1996). The photocurrent was detected by a home-built high-sensitivity amplifier circuit on a CH Instruments (Austin, Tex.) Model 660 electrochemical workstation. No external voltage bias was applied to the cells in any of the photocurrent measurements (i.e., they were short-circuit photocurrents).

Example 1

1,4-Bis(butylamino)-9,10-anthraquinone.

SB35 is a flat molecule with two transition dipole moments along the long and short molecular axes (Saito et al., 1997; Thulstrup and Michl, 1989). Differential scanning calorimetry of this material shows two peaks at 110.7° C. and 120.4° C. (melting point), indicating two phase transitions, which could be seen as distinct colors with the naked eye. The capillary filling of SB 35 from the molten state (~121° C.) into the cells of the glass/SB35/glass produced thin, needle-shaped crystals that formed a fan-like structure shown in FIG. 2A. Needles started from a center point and radiated in all directions; these were visible in ordinary light, polarized light, and with crossed polarizers. The deep color for one particular direction is the result of the irradiated light being polarized in that direction. The structure appeared similar to that seen with smetic liquid crystals (Gray and Goodby, 1984). Note that when the cells were cooled quickly to room temperature after capillary filling, the fans became smaller but still had an identical overall structure. The smallest fan sizes observed with an optical microscope were of the order of tens of micrometers. The diameter of the individual needles was well below the resolution of an optical microscope and in the nanometer range. Films of different thickness, between 0.5 and 5 µm, showed the same appearance. By contrast, large area (~mm$^2$) single-crystal thin films were produced after the same films were recrystallized by the zone melting technique through a single pass. The regrown films consisted of a number of single-crystal domains, each of which showed a single uniform color everywhere within the domain; the color changed systematically upon sample rotation with polarized light or between two crossed polarizers, as expected from a single crystal.

Figure 2:
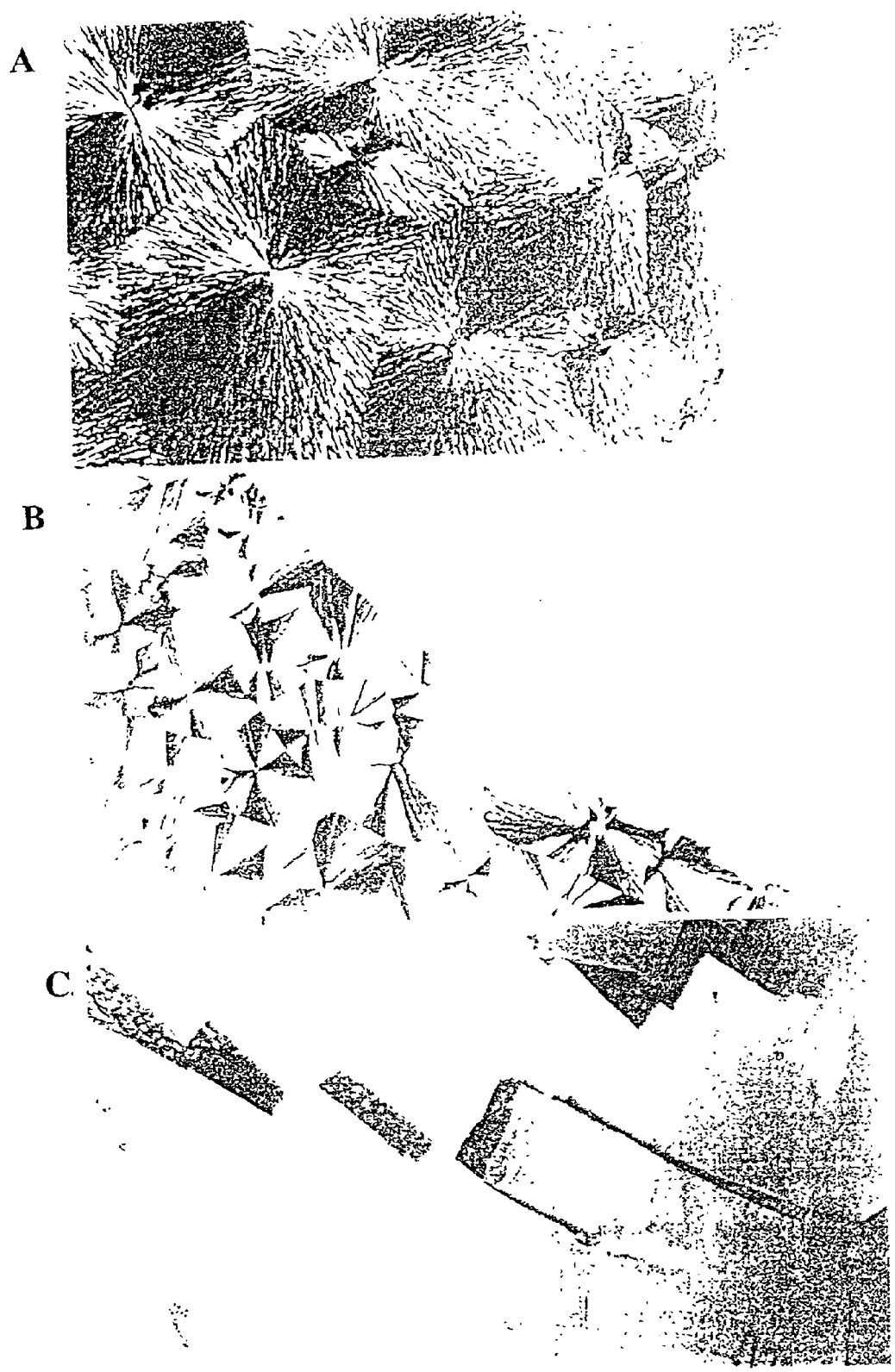
FIG. 2A–C Micrographs of solvent blue 35 crystals between two pieces of glass (area of view, 0.28 mm×0.49 mm).

A comparison of film structure before and after the zone melting step is shown in FIG. 2B. With this sample, the power to the heating wire was turned off when it was near the middle of the film. The regrown part of the film became a single crystal of uniform color while the quickly-cooled recent molten zone and the rest of the crystal (area not melted) still showed fan structures. The grown single crystals were much larger and showed fewer structural defects compared to other organic films grown by an epitaxial technique (Kobayashi, 1991). Note that if the whole cell with a single crystal film was reheated to its molten state and slowly cooled down, the film returned to the fan structure; this could be converted into a single-crystal thin film again after another zone melting process. Such a reversible evolution could be done a number of times without showing apparent changes in the film morphology.

The zone at the end of a zone-melting process showed smaller single crystals that were separated by some structures that appeared dark between two crossed-polarizers (FIG. 2C). These domains are either amorphous or consist of very small crystals in the impurity-rich areas. The near 90° corners and straight edges on the grown single crystals contrast remarkably with the fan structure (FIG. 2A) indicating a low impurity concentration. The growth rate had a strong effect on the crystal quality; with rates of 15–120 µml/min, larger crystals with fewer defects were produced.

Figure 3:
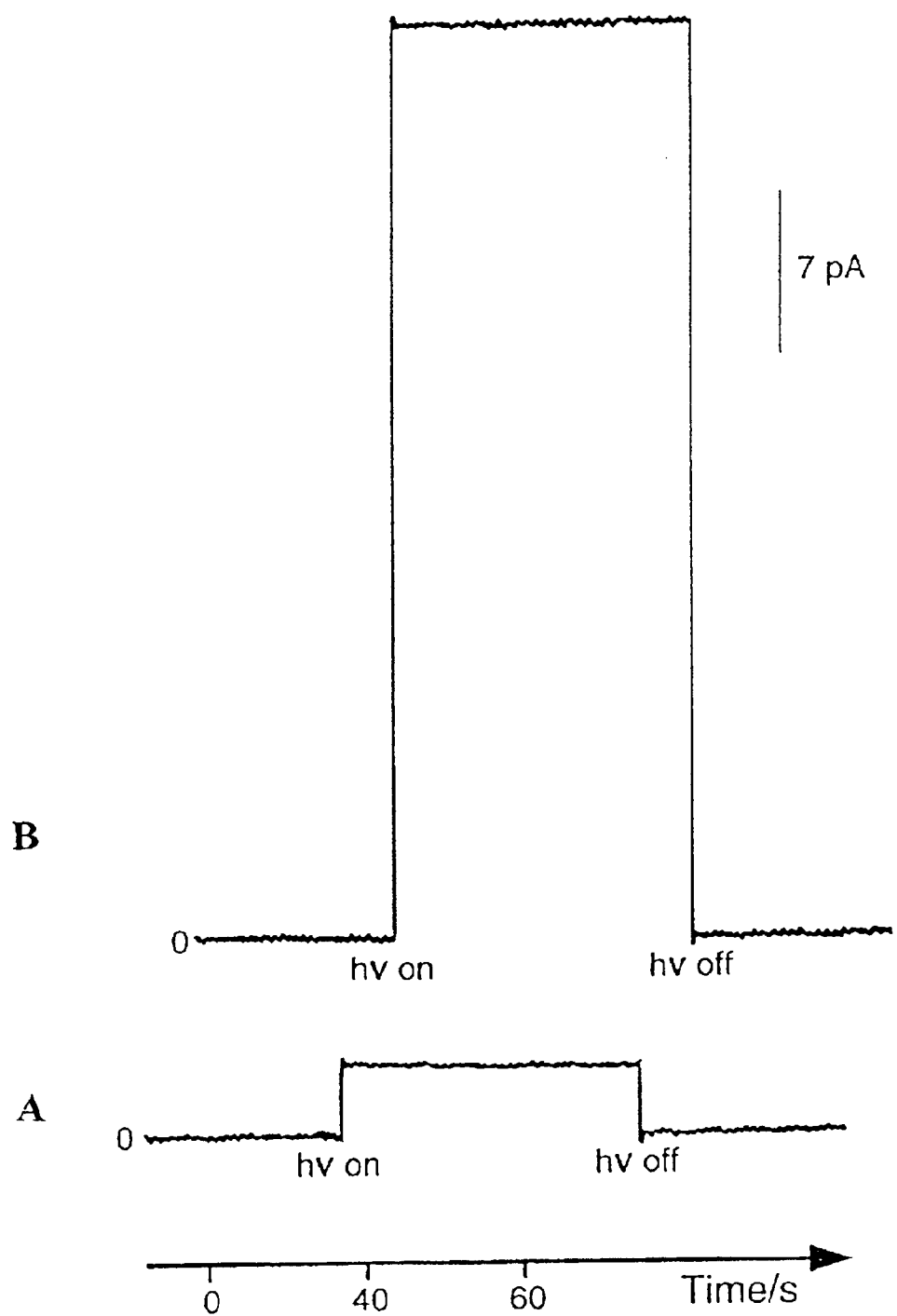
FIG. 3A–B Short-circuit photocurrent as a function of time, generated with white light.
Figure 4:
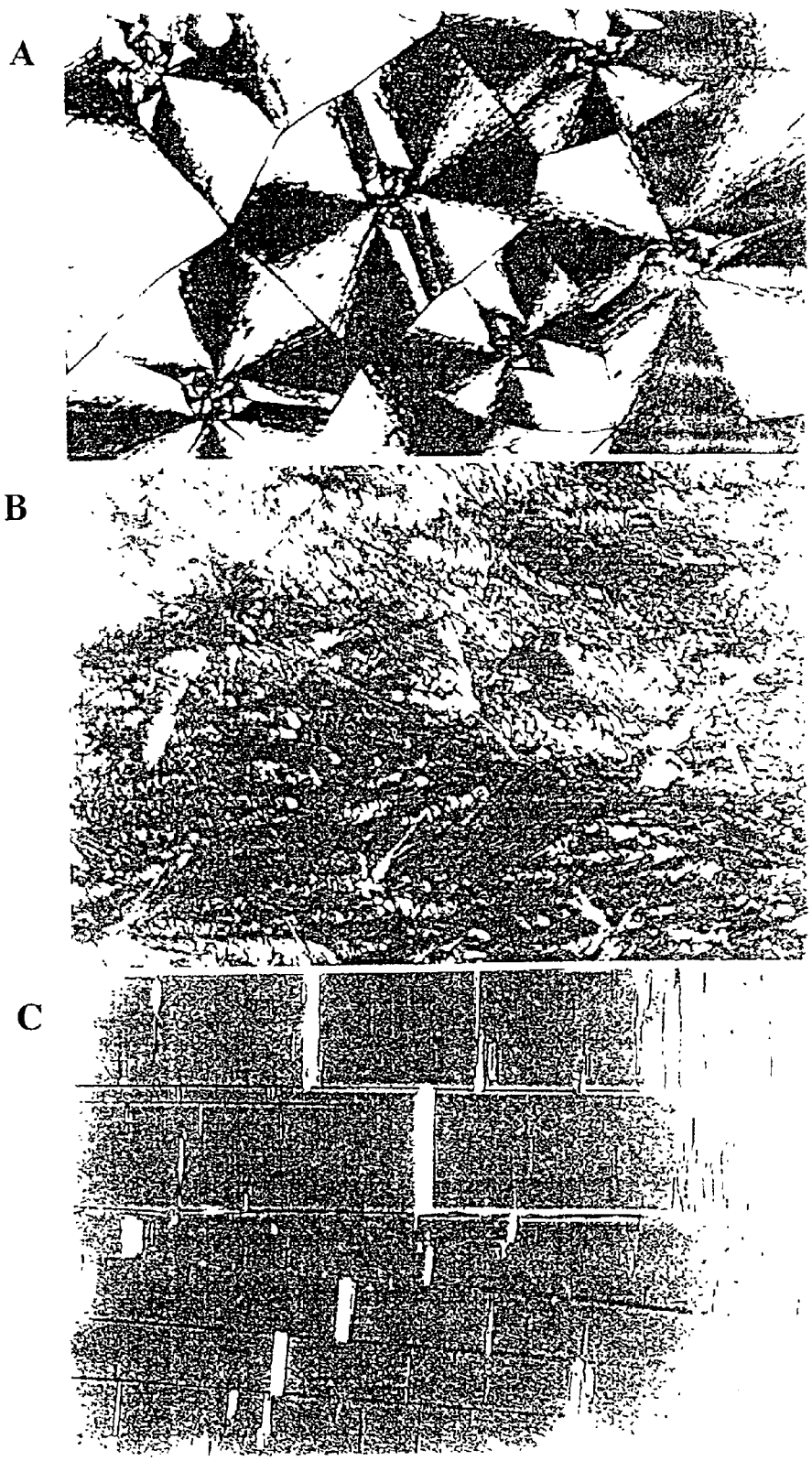
FIG. 4A–C Micrographs of porphyrin 1 thin film (area of view, 0.3 mm×0.5 mm).

FIG. 3 shows that $I_{SC}$ for SB 35 was over one order of magnitude larger in cells containing regrown single-crystal thin films compared to those with needle-shaped crystals measured under identical conditions, indicating a greater crystallinity. In this experiment, ITO-coated glass replaced the glass cover slips as the substrate, but this did not affect the structure of the film. The cell was fixed on the stage of an optical microscope, and the light beam was focused on a spot of ~750 µm diameter in a specific single-crystal domain, as described earlier (Saito et al., 1997). Essentially no variation was observed when the light beam was focused on different locations within the same domain or on similar domains within the polycrystalline films.

needle-shaped crystals arranged in a fan-like structure between two pieces of glass or ITO-coated glass upon capillary filling at its molten state (131° C.). The individual needles were too thin to be seen under ordinary light, but became visible between two crossed polarizers as shown in FIG. 4A. This cell was placed on the heating wire and a molten zone was established. The well-ordered fan-like structure became highly irregular when the power to the heating wire was suddenly turned off (FIG. 4B), while the area that had not melted remained unchanged. In spite of the differences in the initial morphology in different areas, the organic layer could be recrystallized into a single-crystal thin film after a single pass with the zone melting technique at a scan rate of 15 µm/min. A second pass at the same rate did not produce a significant difference in its appearance. However, a third pass at a lower rate of 6 µm/min. caused the single-crystal domains to become larger with fewer apparent defects, as shown in FIG. 4C. In this view, the white rectangular domains are actually air gaps formed during the film shrinkage as the temperature dropped from its molten state to room temperature. The dark straight horizontal lines were also air gaps that could be seen at higher magnification. This result again demonstrates the capability of the zone melting technique to externally control the growth of organic single-crystal thin films.

Figure 5:
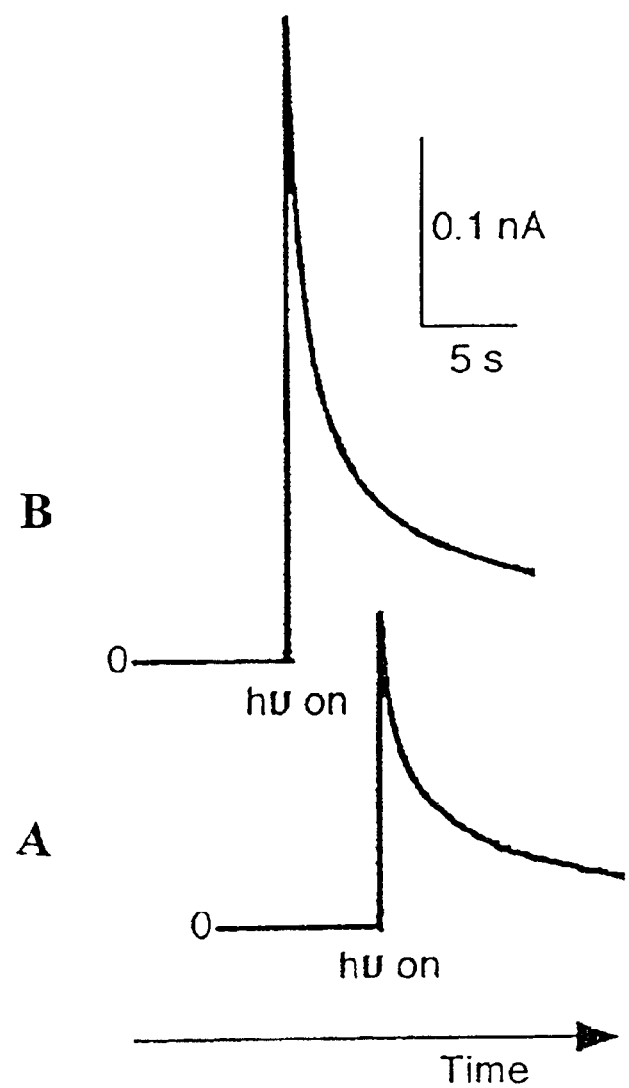
FIG. 5A–B Short-circuit photocurrent of an ITO/porphyrin 1/ITO cell as a function of time by irradiating with 568 nm light. Charge was initially trapped under a bias of −0.2 V with a light at 568 nm for 10 s followed by a rest period of 10 s under short-circuit conditions in the dark.
Figure 6:
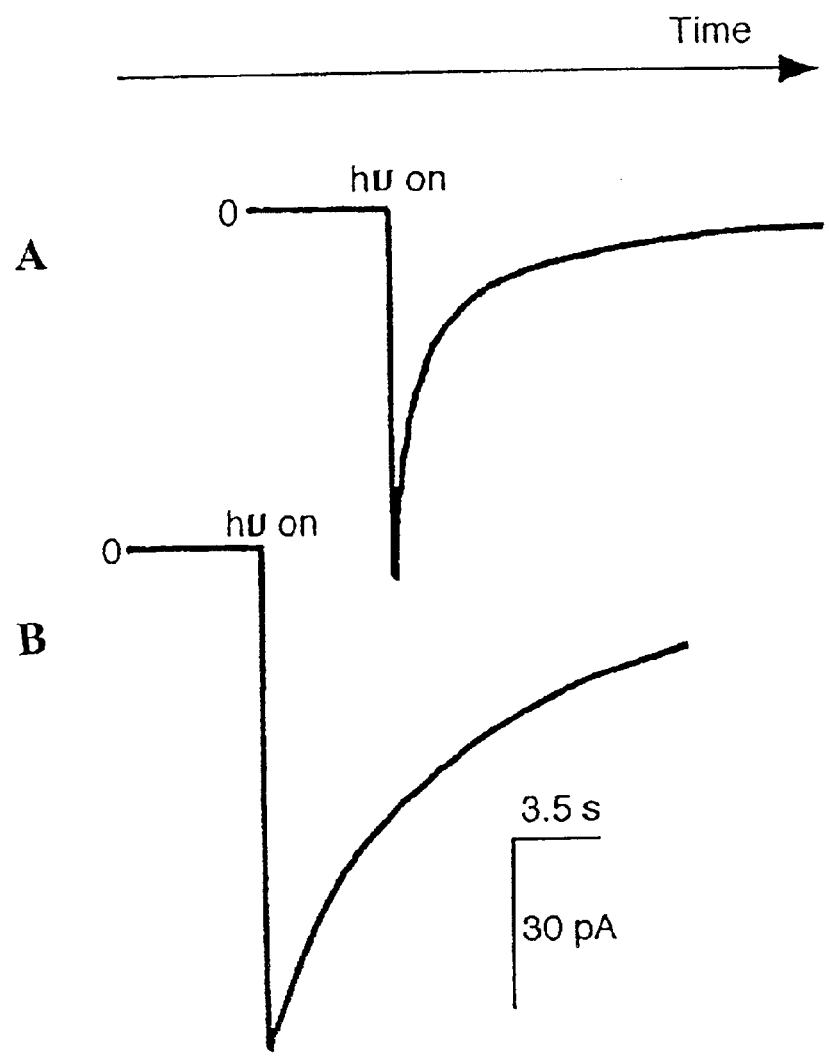
FIG. 6A–B Short-circuit detrapping photocurrent of an ITO/porphyrin 1/ITO cell as a function of time, as in FIG. 5 but under the initial bias of +0.2 V.
Figure 7:
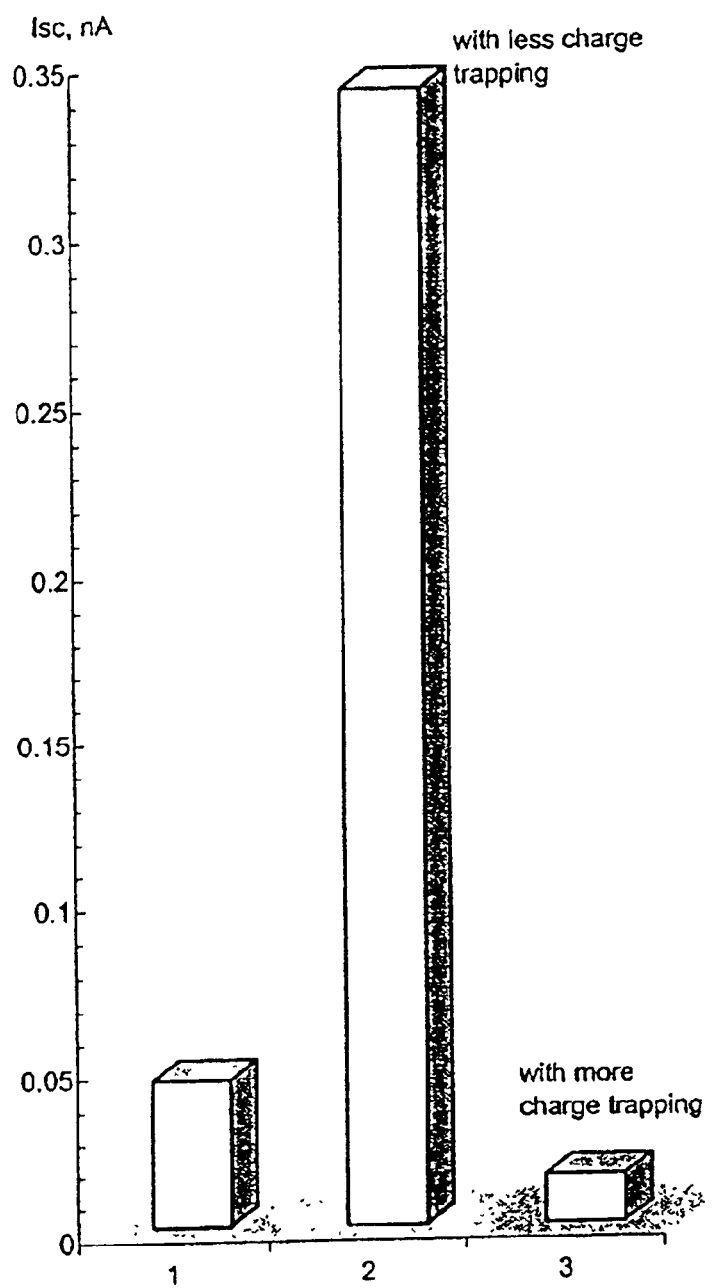
FIG. 7 Steady-state short-circuit photocurrent of an ITO/porphyrin 1/ITO cell at three locations showing different levels of trapping capacity under identical experimental conditions. The highest photocurrent was obtained with the area processed by the zone melting technique.

Charge trapping and detrapping was used for studies of the charge transport properties of the porphyrin 1 molecule. For example, after the cell was charged under a bias voltage of −0.2 V (where the sign given always refers to the irradiated ITO electrode) with irradiation as a wavelength of 568 nm for 10 s and kept in the dark under short-circuit conditions for 10 s, a discharge current, or photocurrent spike, was observed when the charged cell was irradiated again with the same light without a bias voltage (short-circuit), as shown in FIG. 5. In this case, FIGS. 5A and 5B were obtained from a cell showing either the fan-like structure (FIG. 4A) or irregular morphology (FIG. 4B), respectively. Thus organic thin films with a polycrystalline structure has a high capability for charge trapping and detrapping. This conclusion is also true, as shown in FIG. 6, when the same cell was charged under a positive bias of +0.2 V leading to a discharge current spike in a cathodic direction under short circuit. The responses in FIGS. 5A and 6A were obtained from the same spot on the sample, as were those in FIGS. 5B and 6B. However, after the same cell was subjected to a zone melting treatment producing a single-crystal thin film, no discharge spike was seen after the sample was subjected to the same charging procedure under identical conditions (bias of +0.2 or −0.2 V with light at 568 nm). With these cells, the short-circuit photocurrent was essentially constant over time, implying that the charge trapping and detrapping, if any, must be too small to be seen in the single crystal thin film of porphyrin 1. A comparison of steady-state $I_{SC}$ obtained from cells showing different degrees of charge trapping and detrapping is shown in FIG. 7. As expected, films that showed the highest extent of charge trapping and detrapping produced the lowest $I_{SC}$. Thus a significant enhancement of the $I_{SC}$ was achieved by the zone melting process to produce improved quality and purity of the single-crystal thin film. The randomly distributed orientations of the tangled crystals were also perhaps shifted to a more favorable direction for the charge-carrier transport after the film was recrystallized into a single crystal.

Example 2

Zinc(II) meso-5, 10, 15, 20-tetrakis-n-(undecyl) porphyrin (Porphyrin 1)

Porphyrin 1 was synthesized and purified as described by Fox et al. (1998). As with SB 35, porphyrin 1 formed Example 3

Zinc(II)2, 3, 7, 8, 12, 13, 17, 18-octa-n-decylporphyrin (Porphyrin 2)

Porphyrin 2 was synthesized and purified as described by Fox et al. (1998). Porphyrin 2 showed some complications in the zone melting process. First it was difficult to see a molten zone in an ITO/porphyrin 2/ITO cell (while a clear color change was seen in the molten zone with porphyrin 1). Because porphyrin 2 has two phase transitions, at 117° C. (from crystalline to mesophase) and at 177 ° C. (from mesophase to isotropic melt) (Fox et al, 1998), the change from a liquid crystal to an isotropic liquid is much less dramatic than that from a solid to a liquid. To overcome this difficulty, the temperature inside the cells was calibrated by an Omegalabel temperature monitor (Omega, Stamford, Conn.) sandwiched between the two ITO-coated glass slides and placed on the heating wire. The voltage to the wire was slowly increased until a temperature of 182° C. was indicated and then the final voltage was applied from the zone melting process. In this case, the width and uniformity of the molten zone were unknown, so a fine adjustment for the optimization of the molten zone could not be obtained. These films also often showed more than one structure at different locations before and after the zone melting process. The domains with different morphology showed remarkably different optoelectronic properties. Therefore, a large number of cells were prepared for this study to get statistically significant results. This contrasts with cells of SB 35 and porphyrin 1, where only one morphology dominated the whole film (>90% area) before or after the zone melting treatment, although somewhat different structures were also seen at a few locations connected to the edge of the epoxy spacer. The varieties of morphology seen with the porphyrin 2 thin films may be related to the wide temperature range of the liquid crystalline phase (117–177° C.) of this compound. Discotic liquid crystals are known to form at least six different structures (Chandrasekhar 1992). Because the molecules are still mobile at the liquid crystal phase, allowing self-organization, the rate of crystal growth was probably lower than that of the other compounds, allowing formation of several different structures after the heating wire moved beyond the molten zone.

Figure 8:
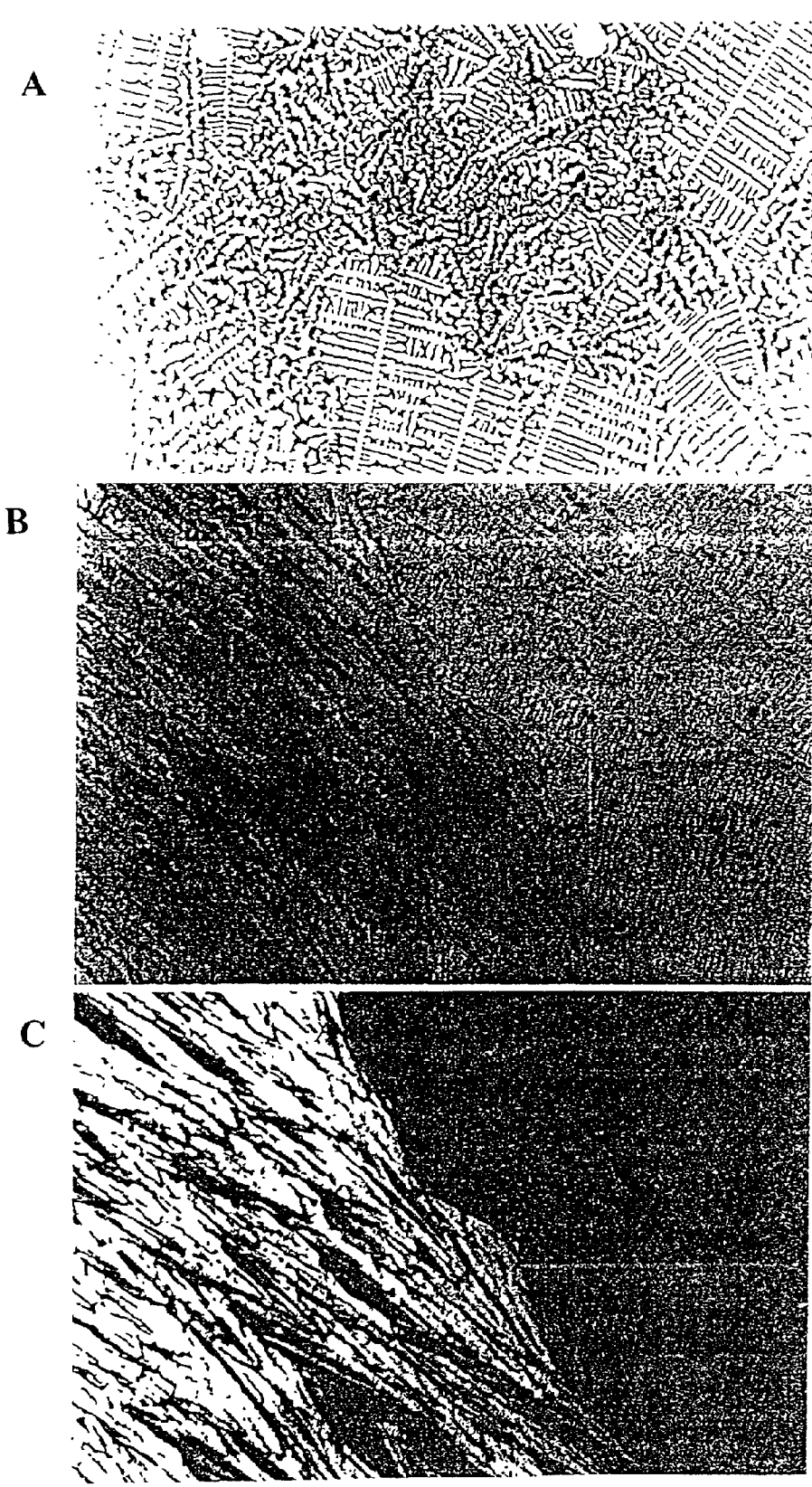
FIG. 8A–C Micrographs of porphyrin 2 thin film grown by capillary filling (area of view, 0.3 mm×0.5 mm).
Figure 9:
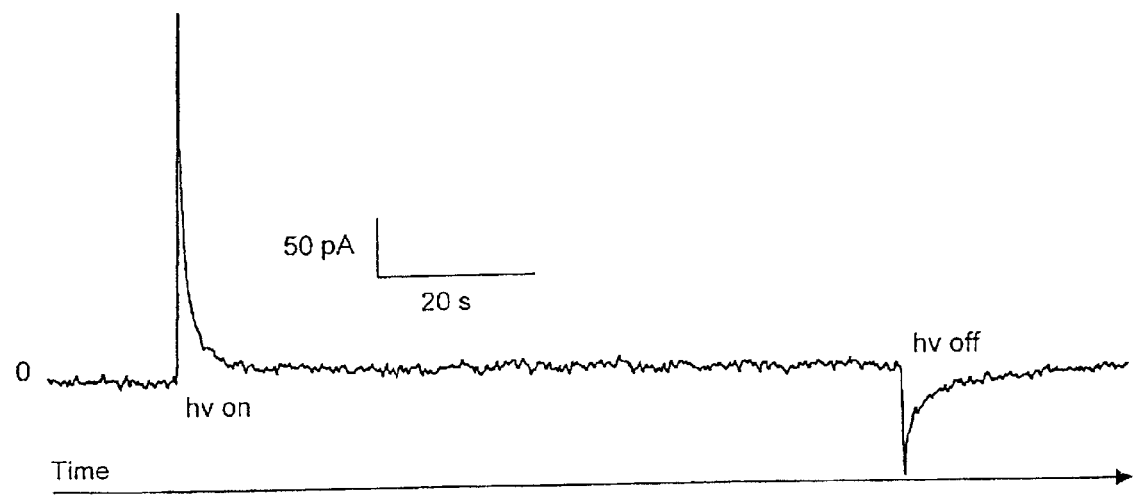
FIG. 9 Short-circuit photocurrent as a function of time for a porphyrin 2 cell with irradiation at 568 nm at the area shown in FIG. 8A. Irradiated spot is 2.5 mm in diameter.

A few common morphologies of porphyrin 2 films are shown in FIG. 8. The most striking feature is that many straight lines appeared in an organized pattern (FIG. 8A). Such a structure could extend for several millimeters. FIG. 9 shows the short-circuit photocurrent as a function of time generated from that area. In this case, light at a single wavelength of 587 nm irradiated the crystal through a hole (2.5 mm in diameter) on an Al plate attached firmly to both the surface of the sandwich cell and the exit of a monochromer. Anodic (or cathodic) $I_{SC}$ spikes were produced when the light was chopped on (and off) and a steady-state $I_{SC}$ was not seen. The organic thin film appeared to be insulating under irradiation, so the photogenerated charge carriers produced by excitation dissociation at the interface were unable to travel through the film, leading to a transient charge and discharge photocurrent. These straight lines in FIG. 8A appeared black between two crossed polarizers as examined under an optical microscope, indicating an amorphous structure that does not show good charge carrier transport properties.

FIG. 8B shows two neighboring domains in which the right portion is similar to that in FIG. 8A; the straight lines were slightly thinner but were clearly seen at high magnification. The left portion was a crystalline structure which sharply contrasts to the domain on the right when examined between two crossed polarizers (FIG. 8C). Although the crystal appeared to be of poor quality, the left domain generated a steady-state $I_{SC}$ that was essentially constant over time for 30 min and no photocurrent spikes were observed when the light was chopped on and off. In the dark domain at right, however, $I_{SC}$ vs. t was similar to that shown in FIG. 9, except that the charge and discharge photocurrent decayed more slowly. Previously, the inventors have studied the effect of structure order on charge-carrier transport through thin-layer cells of ITO/ZnODEP/ITO (Liu et al., 1995) by monitoring the current flow as a function of temperature. The current dropped sharply at the melting point when the crystal structure changed into a disordered isotropic liquid, while the current increased suddenly during cooling when the randomly-oriented ZnODEP molecules in the liquid state reordered into a regular molecular crystal at the transition to mesophase. The electrically conducting molecular stacks between the two electrodes switched on and off when the molecules were reversibly changed between ordered and disordered structures at the melting point. Such an effect was even more clearly seen in the present study where the disordered (amorphous) and the ordered structures were all in the same solid state.

Figure 10:
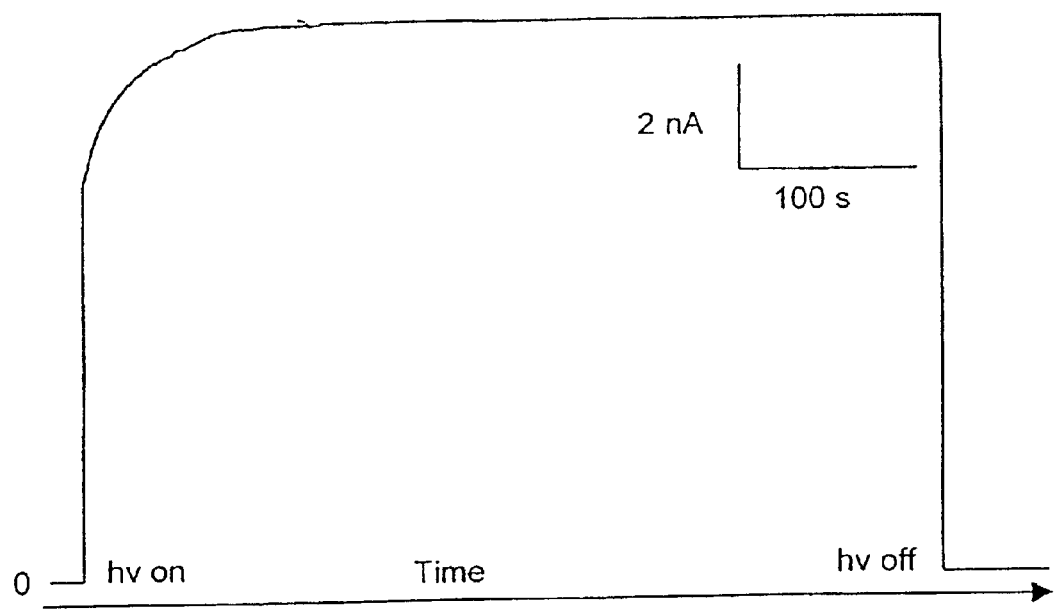
FIG. 10 Short-circuit photocurrent as a function of time for a porphyrin 2 cell with irradiation at 568 nm from a regrown crystal domain. Irradiated spot is 2.5 mm in diameter.
Figure 11:
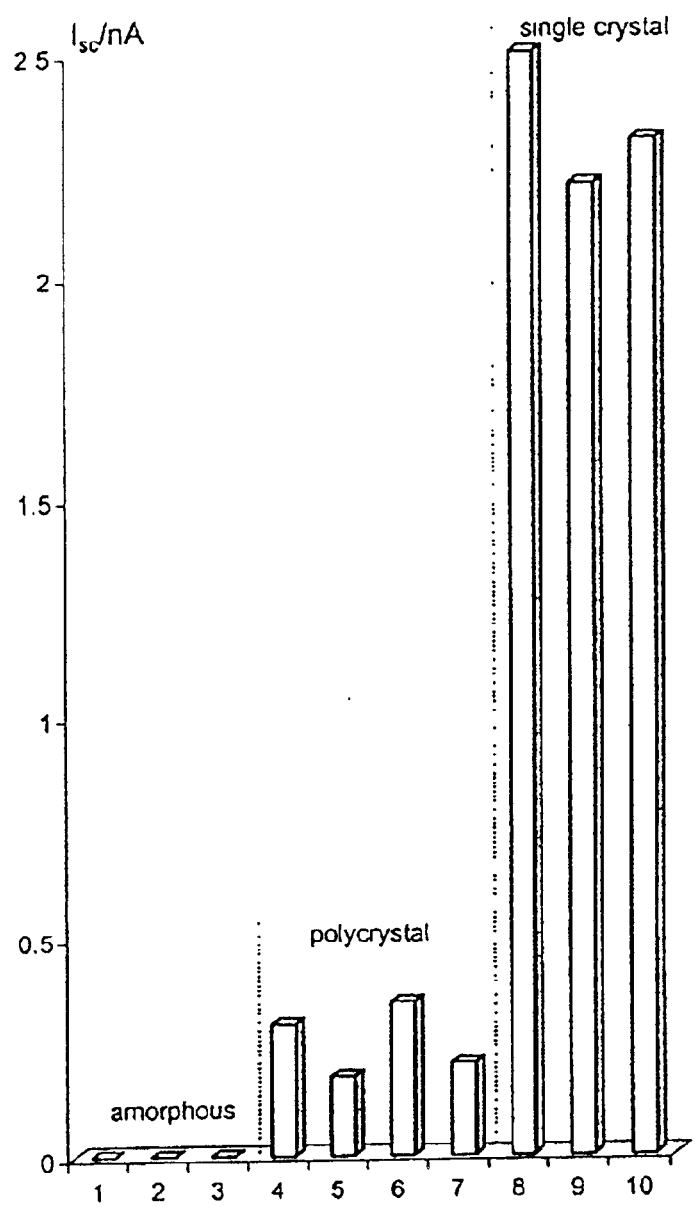
FIG. 11 Steady-state short-circuit photocurrent of a porphyrin 2 cell at different locations showing different levels crystallinity under identical experimental conditions. Irradiated spot, 300 μm in diameter.

After recrystallization by the zone melting process, the single-crystal thin films produced were similar to those in FIG. 4C. In these, the steady-state $I_{SC}$ increased significantly, as shown in FIG. 10, compared to those produced under identical experimental conditions (shown in FIG. 9). Such a dramatic improvement in the $I_{SC}$ generation demonstrates again the value of the zone melting technique. FIG. 11 shows the steady-state $I_{SC}$ obtained from different domains in the same or different cells. In these measurements, cells were fixed on the stage of the optical microscope whose light source was used for irradiation through the objective. Each domain was first examined with polarized light, but the photocurrent measurement was obtained without a polarizer (Saito et al., 1997; Liu et al., 1996). The amorphous domains produced a near zero photocurrent, while the single-crystal domains generated the largest $I_{SC}$. Between these two extremes, intermediate $I_{SC}$ values were obtained from polycrystalline domains, in which the crystal orientation may play an important role (Saito et al, 1997; Liu et al., 1996), in addition to the grain boundary effect in slowing down the charge carrier transport. As in the case of porphyrin I shown above, more charge trapping occurred with the polycrystalline domains than with the single-crystal ones.

Example 4

Spacer Effects

The film morphology at some locations in contact with the epoxy cement used as a spacer was somewhat different from that in other areas, and the structure of the recrystallized films depended on whether the epoxy spacer in a cell was initially aligned parallel or perpendicular to the heating wire for porphyrin 2. In the parallel case, the epoxy would influence the initial crystallization in the first molten zone, while in the perpendicular orientation, the epoxy existed only at the two ends (FIG. 1B), indicating that the first crystal structure (the seed crystal) was important. Thus, the zone melting technique is probably a primarily single-crystal growth method resembling the traditional pulled crystal growth technique, during which the impurities are rejected by the growing solid and accumulate in the liquid moving slowing toward the other end. This conclusion is supported by the fact that the fan-like structure (SB 35) reappeared after films formed by the zone melting process, which produced single-crystal thin films, were uniformly heated again to the melting point briefly and then cooled to room temperature. In this case it was unlikely that the impurities accumulated at the end would spread fast enough to affect the whole film.

Example 5

Numerous Passes Through the Melt Zone

Because the zone melting technique can also purify the materials during the crystallization, the large area single-crystal thin films should be purer than the original films. This higher purity may be a factor in the formation of the large single-crystal thin films. To test this assumption, a number of cells were processed with several passes of zone melting, the hypothesis being that as the film was made purer after consecutive passes, the crystal domain should become larger. Such a relationship, however, was not observed. Moreover, the photocurrent response did not generally improve with the total number of passes.

References

The following references are incorporated herein by reference:

U.S. Pat. No. 5,327373.
Adachi et al., *Appl. Phys. Lett.,* 1989, 55, 1489.
Baldo et al., *Appl. Phys. Lett.,* 1999, 75, 4.
Burrows et al., *Appl. Phys. Lett.,* 1994, 64, 2285.
Chandrasekhar, *Liquid Crystals,* Cambridge University Press, $2^{nd}$ ed., 1992.
Chondroudis, K. and Mitzi, D. B., *Appl. Phys. Lett.,* 2000, 76, 58.
Curry et al., *Appl. Phys. Lett.,* 1999, 75, 1380.
Forrest, *Chem. Rev.,* 97:1793–1896, 1997.
Fox, Vincent, Melamed, Torimoto, Liu, Bard, *Chem. Mater.,* 10:1771–1776, 1998.
Gray, Goodby, *Smetic Liquid Crystals,* Leonard Hill: Glasgow, 1984.
Gregg, Fox, Bard, *J. Phys. Chem.,* 94:1586, 1990.
Hamada et al., *Appl. Phys. Lett.,* 1998, 72, 1939.
Hamada et al., *Appl. Phys. Lett.,* 1997, 71, 3338.
Hamada et al., *Appl. Phys. Lett.,* 1999, 75, 1682.
Karl, In *Crystals, Growth, Properties, and Applications,* Freyhardt, (Ed.); Springer Verlag: Heidelberg; 4:1–100, 1980.
Karl, *Mol. Liq. Crys.,* 171:157–177, 1989.
Kido et al., *Science,* 1995, 267, 1332.
Kobayashi, In *Crystals, Growth, Properties and Application 13, Organic Crystsals Characterization,* Springer-Verlag: Berlin 1991.
Lawson and Nielson, *Preparation of Single Crystals;* Butterworths: London, 1958.
Liu and Bard, *Acc. Chem. Res.,* 32:235–245, 1999.
Liu and Bard, *Am. Chem. Soc.,* 120:5575, 1998b.
Liu and Bard, *Chem. Mater.,* 10:840, 1998a.
Liu, Hasty, Bard, *J. Electrochem. Soc.,* 143:1916, 1996b.
Liu, Lynch, Bard, *Chem. Mater.,* 9:943, 1997.
Liu, Pan, Fox, Bard, *Chem. Mater.,* 9:1422, 1997.
Liu, Pan, Fox, Bard, *Science,* 261:897, 1993.
Liu, Pan, Tang, Fox, Bard, *J. Phys. Chem.,* 99:7632, 1995.
Liu, Tang, Bard, *J. Phys. Chem.,* 100:3587, 1996a.
O'Brien et al., *Appl. Phys. Lett.,* 1999, 74, 442.
Saito, Liu, Baird, *Chem. Mater.,* 1318, 1997.
Sheats, Antoniadis, Hueschen, Leonard, Miller, Moon, Roitman, Stocking, *Science,* 273:884–888, 1996.
Strukelj et al., *Am. Chem. Soc.,* 1996, 118, 1213.
Tao et al., *Am. Chem. Soc.,* 1999, 121, 9447.
Thulstrup and Michl, *Elementary Polarization Spectroscopy,* VCH: New York, 1989.
Treggold, *Order in Thin Organic Films,* Cambridge University Press: Cambridge, 1994.
Wright, *Molecular Crystals,* 2d ed.; Cambridge University Press: Cambridge, 1995.
Tang, S. W. and Vanslyke, S. A. *Appl. Phys. Lett.,* 1987, 51, 913.
Yang et al., *Synthetic Metals,* 2000, 108, 95.
Zhang et al., *Synthetic Metals,* 1999, 106, 157.

Although the present invention and its advantages have been described in detail, it should be understood that various changes, substitutions and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed:

1. A method for treating a single material or amorphous thin film comprising:
    (a) providing a substrate coated with a single material or amorphous thin film;
    (b) positioning said substrate proximal to a heat source at a distance and for a time sufficient to form a heating zone in said film, wherein said heat zone is below the decomposition temperature of said film; and
    (c) moving said substrate relative to said heater source at a speed sufficient to permit formation of a heating zone in said thin film proximal to said heat source.

2. The method of claim 1, wherein said thin film comprises an organic compound.

3. The method of claim 1, wherein said thin film comprises an inorganic compound.

4. The method of claim 1, wherein said substrate is passed proximal to said heat source twice.

5. The method of claim 1, wherein said substrate is passed proximal to said heat source three times.

6. The method of claim 1, wherein said substrate is passed proximal to said heat source four times.

7. The method of claim 1, wherein said substrate is passed proximal to said heat source multiple times.

8. The method of claim 7, wherein at least two different speeds are used for different passes.

9. The method of claim 1, wherein the film is melted by said heat source.

10. A crystalline thin film produced by a method comprising:
    (a) providing a substrate coated with a single material or amorphous thin film;
    (b) positioning said substrate proximal to a heat source at a distance and for a time sufficient to form a heating zone in said film, wherein said heat zone is below the decomposition temperature of said film; and
    (c) moving said substrate relative to said heater source at a speed sufficient to permit formation of a heating zone in said thin film proximal to said heat source.

11. A method for producing an organic crystalline thin film comprising:

(a) providing an organic compound in a sample holder, said organic compound being provided in the form of a single material or amorphous thin film;

(b) positioning said sample holder proximal to a heat source at a distance and for a time sufficient to form a molten zone in said organic compound proximal to said heater source; and (c) moving said sample holder relative to said heater source at a speed sufficient to permit formation of a molten zone in said organic compound proximal to said heat source, wherein said organic compound forms an organic single-crystal thin film after exposure to said heat source.

12. The method of claim 11 wherein said sample holder comprises two parallel flat surfaces.

13. The method of claim 12, wherein said flat surfaces are glass.

14. The method of claim 13, wherein said glass is coated with indium-tin-oxide.

15. The method of claim 12, wherein said parallel flat surfaces are separated by about 0.1 $\mu$m to about 50 $\mu$m.

16. The method of claim 15, wherein said parallel flat surfaces are separated by about 1.5 $\mu$m to about 2.5 $\mu$m.

17. The method of claim 10, wherein said crystalline thin film has an enhanced steady-state short-circuit photocurrent as compared to the corresponding amorphous thin film.

18. The method of claim 17, wherein the enhancement is an order of magnitude.

19. The method of claim 18, where in the enhancement is two orders of magnitude.

20. The method of claim 19, where in the enhancement is three orders of magnitude.

21. The method of claim 11, wherein said organic single-crystal thin film contains fewer impurities than said organic compound of step (a).

22. The method of claim 11 wherein said speed is about 3 $\mu$m/min to about 120 $\mu$m/min relative to said heating source.

23. The method of claim 11, wherein said heating source is a wire.

24. The method of claim 23, wherein said wire is in a linear configuration.

25. The method of claim 23, wherein said wire is about 10 $\mu$m to about 3.0 mm in diameter.

26. The method of claim 25, wherein said wire is about 50 $\mu$m to about 2.0 mm in diameter.

27. The method of claim 23, wherein said wire is platinum.

28. The method of claim 23, wherein said wire is nichrome.

29. The method of claim 23, wherein said wire is heated electrically.

30. The method of claim 23, wherein said wire is tightened after initiation of heating.

31. The method of claim 11, wherein said molten zone is about 0.5 mm to about 2.0 mm wide.

32. The method of claim 11, wherein said organic compound is a porphoryin.

33. The method of claim 32, wherein said organic compound is 1,4-bis(butylamino)-9,10-anthraquinone.

34. The method of claim 32, wherein said organic compound is zinc(II)meso-5,10,15,20-tetrakis-n-(undecyl) porphyrin.

35. The method of claim 32, wherein said organic compound is zinc(II)2,3,7,8,12,13,17,18-octa-n-decylporphorin.

36. The method of claim 11, wherein said sample holder is passed proximal to said heat source twice.

37. The method of claim 11, wherein said sample holder is passed proximal to said heat source three times.

38. The method of claim 11, wherein said sample holder is passed proximal to said heat source four times.

39. The method of claim 11, wherein said sample holder is passed proximal to said heat source multiple times.

40. The method of claim 39, wherein at least two different speeds are used for different passes.

41. The method of claim 11, wherein said thin film is prepared by evaporation onto a surface.

42. The method of claim 11, wherein said thin film is prepared by capillary filling.

43. The method of claim 11, wherein said thin film is prepared by deposition onto a surface.

44. The method of claim 11, wherein said thin film is prepared by spin coating.

45. An organic crystalline thin film produced by a method comprising, said organic compound being provided in the form of a single material or amorphous thin film:

(a) providing an organic compound in a sample holder;

(b) positioning said sample holder proximal to a heat source at a distance and for a time sufficient to form a molten zone in said organic compound proximal to said heater source; and (c) moving said sample holder relative to said heater source at a speed sufficient to permit formation of a molten zone in said organic compound proximal to said heat source.

\* \* \* \* \*